(12) United States Patent
Matsuoka

(10) Patent No.: US 9,087,712 B2
(45) Date of Patent: Jul. 21, 2015

(54) SEMICONDUCTOR DEVICE

(75) Inventor: Toru Matsuoka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 38 days.

(21) Appl. No.: 13/103,353

(22) Filed: May 9, 2011

(65) Prior Publication Data

US 2012/0068329 A1 Mar. 22, 2012

(30) Foreign Application Priority Data

Sep. 16, 2010 (JP) ................................. 2010-207572

(51) Int. Cl.
*H01L 27/24* (2006.01)
*H01L 27/02* (2006.01)
*H01L 29/08* (2006.01)
*H01L 29/10* (2006.01)
*H01L 29/41* (2006.01)
*H01L 27/06* (2006.01)
*H01L 25/07* (2006.01)
*H02M 3/158* (2006.01)

(52) U.S. Cl.
CPC .......... *H01L 27/0664* (2013.01); *H01L 25/072* (2013.01); *H01L 27/0203* (2013.01); *H01L 27/24* (2013.01); *H01L 27/2409* (2013.01); *H01L 29/08* (2013.01); *H01L 29/10* (2013.01); *H01L 29/41* (2013.01); *H01L 2924/0002* (2013.01); *H01L 2924/1203* (2013.01); *H01L 2924/13055* (2013.01); *H01L 2924/13091* (2013.01); *H02M 3/158* (2013.01)

(58) Field of Classification Search
USPC ......... 257/573, 177, 502, 563, 577, 584, 392, 257/393, 361, E27.02, E27.037, E29.327
See application file for complete search history.

(56) References Cited

U.S. PATENT DOCUMENTS

| 3,304,431 | A | * | 2/1967 | Biard et al. | .................... 250/551 |
| 4,354,223 | A | * | 10/1982 | Turnbull | ....................... 363/124 |
| 6,204,717 | B1 | * | 3/2001 | Nagasu et al. | ................ 327/318 |

(Continued)

FOREIGN PATENT DOCUMENTS

| CN | 1855476 A | 11/2006 |
| EP | 2 221 972 A2 | 8/2010 |

(Continued)

OTHER PUBLICATIONS

Japanese Office Action dated Sep. 24, 2013 (and partial English translation thereof) for Japanese Patent Application No. 2010-207572.

(Continued)

*Primary Examiner* — David Zarneke
(74) *Attorney, Agent, or Firm* — Oblon, McClelland, Maier & Neustadt, L.L.P.

(57) ABSTRACT

The present invention provides a semiconductor device capable of selecting a desired circuit (step-down circuit (or step-up/step-down circuit) and step-up circuit) on the user side at low cost. A semiconductor device according to the present invention includes a diode element and a switching element (IGBT). An anode terminal of the diode element and one main electrode terminal of the switching element are adjacently arranged at a predetermined distance from each other. In addition, a cathode terminal of the diode element and the other main electrode terminal of the switching element are adjacently arranged at another predetermined distance from each other.

11 Claims, 4 Drawing Sheets

(56) References Cited

U.S. PATENT DOCUMENTS

| | | | |
|---|---|---|---|
| 7,015,561 B2* | 3/2006 | Saxelby et al. | 257/502 |
| 7,602,045 B2* | 10/2009 | Nagase et al. | 257/577 |
| 7,755,167 B2* | 7/2010 | Hirota et al. | 257/577 |
| 2002/0008319 A1* | 1/2002 | Davis et al. | 257/723 |
| 2004/0222484 A1* | 11/2004 | Saxelby et al. | 257/502 |
| 2006/0244116 A1 | 11/2006 | Tsunoda | |
| 2007/0194346 A1* | 8/2007 | Nagase et al. | 257/146 |
| 2008/0179704 A1* | 7/2008 | Hirota et al. | 257/499 |
| 2008/0304306 A1* | 12/2008 | Chang et al. | 363/147 |
| 2009/0140414 A1 | 6/2009 | Soyano et al. | |
| 2010/0213915 A1 | 8/2010 | Kora et al. | |
| 2011/0316494 A1* | 12/2011 | Kitamura et al. | 323/229 |
| 2012/0241819 A1* | 9/2012 | Zhang | 257/195 |
| 2012/0241953 A1* | 9/2012 | Yamada et al. | 257/737 |

FOREIGN PATENT DOCUMENTS

| | | |
|---|---|---|
| JP | 9-322531 | 12/1997 |
| JP | 11-113253 | 4/1999 |
| JP | 2000-235997 | 8/2000 |
| JP | 2003-258194 | 9/2003 |
| JP | 2007-294669 | 11/2007 |

OTHER PUBLICATIONS

Office Action issued Nov. 28, 2013 in German Patent Application No. 10 2011 081 426.4 (with partial English language translation).

Rohm Co., Ltd.: Discrete Semiconductors—Bipolar Transistors, Digital Transistors. Japan, Apr. 2009, pp. 15-16. Company's document http://www.digikey.com/WEb%20Export/Supplier%20Content/ROHM_511/PDF/ROHM_Transistors.pdf?redirected=1.

Rohm Co., Ltd.: Low-frequency transistor (isolated transistor and diode) UML2N. Japan, undated, p. 1. Company's document http://rohmfs.rohm.com/en/products/databook/datasheet/discrete/transistor/bipolar/uml2n.pdf.

Digi-Key Corporation: Head Start—Technology of worldwide leading manufacturers. Catalogue DE091. USA, 2009, p. 1449. Company's document.

Rohm Co., Ltd.: 2.5V Drive Nch+SBD MOSFET—US5U1. Japan, undated, p. 1. Company's document http://rohmfs.rohm.com/en/products/databook/datasheet/discrete/transistor/mosfet/us051.pdf.

Mitel Semiconductor: GP600FHB16S—Powerline N-Channel IGBT Module. UK, Dec. 1998, pp. 1-8. Company's document http://pdf.datasheetarchive.com/indexerfiles/Scans-054/DSAIH00087381.pdf.

Office Action issued Oct. 25, 2013 in Chinese Application No. 201110283517.2 (With Partial English Translation).

Summons to Attend a Hearing issued Apr. 7, 2014, in German Patent Application No. 10 2011 081 426.4 (with English-language translation).

Supplemental Letter to the Summons issued Apr. 7, 2014, in German Patent Application No. 10 2011 081 426.4 (with English-language translation).

"2.5V Drive Nch+SBD MOSFET", TRANSISTORS, ROHM, US6U37, 2008, 5 pages.

German Decision to reject the present Application issued Jul. 29, 2014, in German Patent Application No. 10 2011 081 426.4 (with English translation).

Chinese Office Action issued Jun. 16, 2014 in Patent Application No. 201110283517.2 (with partial English translation).

* cited by examiner

US 9,087,712 B2

SEMICONDUCTOR DEVICE

BACKGROUND OF THE INVENTION

1. Field of the Invention

The present invention relates to a semiconductor device and more particularly, to a semiconductor device capable of forming a chopper circuit.

2. Description of the Background Art

Conventionally, there are circuits such as a step-down circuit, a step-up circuit, and a step-up/step-down circuit as DC-DC convertor circuits. Each of the step-down circuit, the step-up circuit, and the step-up/step-down circuit has a circuit configuration including a diode element and an IGBT (Insulated Gate Bipolar Transistor) serving as a switching element.

The step-down circuit and the step-up/step-down circuit include, for example, a configuration in which a cathode terminal of the diode element is connected to an emitter terminal of the IGBT (first type circuit: refer to FIG. 2). On the other hand, the step-up circuit includes, for example, a configuration in which an anode terminal of the diode element is connected to a collector terminal of the IGBT (second type circuit: refer to FIG. 3).

In addition, a chopper circuit having the first type circuit and a chopper circuit having the second type circuit have the well-known circuit configurations. For example, a step-up chopper circuit having the first type circuit is disclosed in Japanese Patent Application Laid-Open No. 11-113253 (1999). Meanwhile, a step-down chopper circuit and a step-up/step-down chopper circuit having the second type circuit are disclosed in Japanese Patent Application Laid-Open No. 09-322531 (1997).

However, according to the conventional configurations, it is necessary to prepare a semiconductor device having the first type circuit and a semiconductor device having the second type circuit, depending on intended usage. Therefore, since the two kinds of semiconductor devices need to be prepared, it is necessary to provide many circuit elements, which increases cost. In addition, on a user side, it is required to be able to easily select the step-down circuit (or step-up/step-down circuit) and the step-up circuit, in response to a request of the user.

SUMMARY OF THE INVENTION

It is an object of the present invention to provide a semiconductor device capable of selecting a desired circuit (step-down circuit (or step-up/step-down circuit) and step-up circuit) at low cost on the user side.

According to the present invention, a semiconductor device includes a case, a diode element individually arranged in the case, a switching element individually arranged in the case, an anode terminal arranged outside the case and electrically connected to an anode electrode of the diode element, one main electrode terminal arranged outside the case and electrically connected to one main electrode of the switching element, a cathode terminal arranged outside the case and electrically connected to a cathode electrode of the diode element, and the other main electrode terminal arranged outside the case and electrically connected to the other main electrode of the switching element. Thus, the anode terminal and the one main electrode terminal are adjacently arranged at a predetermined distance from each other, and the cathode terminal and the other main electrode terminal are adjacently arranged at another predetermined distance from each other.

Thus, a chopper circuit can be easily formed in the semiconductor device with a burden reduced on the user side at low cost, depending on intended usage of a user.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, the present invention will be described in detail based on drawings showing its preferred embodiment.

Figure 1:
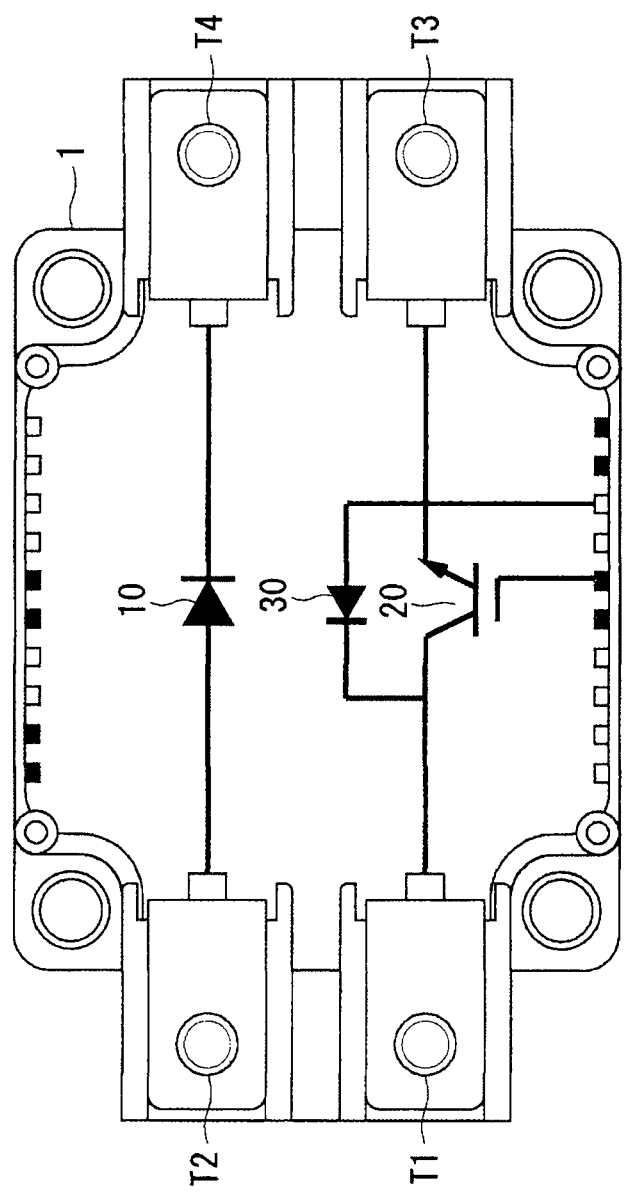
FIG. 1 is a circuit diagram showing a substantial configuration of a semiconductor device according to the present invention.

FIG. 1 is a circuit diagram showing a substantial configuration of a semiconductor device according to the present invention. As shown in FIG. 1, the semiconductor device includes a case 1, and at least a diode element 10 and an IGBT 20 serving as a switching element 20 are arranged in the case 1 in a circuit arranging step. In addition, in the circuit arranging step, at least terminals T1, T2, T3, and T4 are arranged outside the case 1. In this case, as shown in FIG. 1, each of the diode element 10 and the switching element 20 is arranged as an individual element.

The terminal T2 is electrically connected to the side of an anode (anode electrode side) of the diode element 10, and the terminal T4 is electrically connected to the side of a cathode (cathode electrode side) of the diode element 10. The external terminal. T2 electrically connected to the anode electrode is regarded as an anode terminal. Meanwhile, the external terminal T4 electrically connected to the cathode electrode is regarded as a cathode terminal.

Meanwhile, the terminal T1 is electrically connected to the side of a collector (collector electrode side) of the IGBT 20, and the terminal T3 is electrically connected to the side of an emitter (emitter electrode side) of the IGBT 20. The terminal T1 can be regarded as one main electrode terminal electrically connected to the collector electrode, and the terminal T3 can be regarded as the other main electrode terminal electrically connected to the emitter electrode.

As shown in FIG. 1, after the circuit arranging step, the diode element 10 and the IGBT 20 are being arranged in parallel (vertically in line in FIG. 1) in the case 1. More specifically, the diode element 10 and the IGBT 20 are arranged in parallel at a predetermined distance from each other in a planar view. In other words, the diode element 10 and the IGBT 20 are arranged in the case 1 such that a direction of a current flowing between the terminal T2 and the terminal T4 through the diode element 10 is parallel to a direction of a current flowing between the terminal T1 and the terminal T3 through the IGBT 20 (both directions are right to left directions in FIG. 1).

As shown in FIG. 1, the terminal T2 and the terminal T1 are adjacently arranged at a predetermined distance from each other in a vertical direction in FIG. 1, outside the substrate 1. In addition, the terminal T4 and the terminal T3 are adjacently arranged at the predetermined distance from each other in the vertical direction in FIG. 1, outside the case 1. For example, a distance between a center of the terminal T2 and a center of the terminal T1, and a distance between a center of the terminal T4 and a center of the terminal T3 are about 2 to 3 cm. In addition, a distance between the center of the terminal T2 and the center of the terminal T4, and a distance between the center of the terminal T1 and the center of the terminal T3 are about 8 to 9 cm.

In addition, the terminals T1 and T2 are arranged in one edge part of the case 1 (left side of the case 1 in FIG. 1), and the terminals T3 and T4 are arranged in the other edge part opposed to the one edge part of the case 1 (right side of the case 1 in FIG. 1).

In addition, other wiring has been performed in the case 1. For example, a flywheel diode 30 is arranged parallel to the IGBT 20, and a control electrode of the IGBT 20 is wired in the case 1.

Thus, the semiconductor device having the configuration shown in FIG. 1 is supplied to a user, and the user takes over the work of the semiconductor device, that is, carries out a wire connecting process in the semiconductor device, depending on intended usage on the user side.

Figure 2:
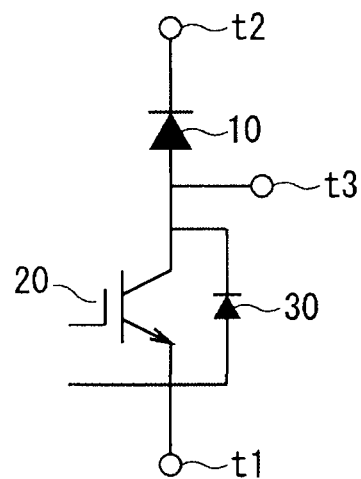
FIG. 2 is a circuit diagram showing a major configuration of a step-up chopper circuit when an IGBT is used as a semiconductor switching device.

For example, when the user wants to form a step-up chopper circuit, the user electrically connects the terminal T1 to the terminal T2 with a wire or the like in the semiconductor device shown in FIG. 1, whereby a step-up chopper circuit having a configuration shown in FIG. 2 is formed in the semiconductor device.

Here, in FIG. 2, a terminal t1 is connected to the side of the ground (or a minus potential), and a terminal t3 is connected to the side of an input (plus potential), and a terminal t2 serves as an output terminal.

Figure 3:
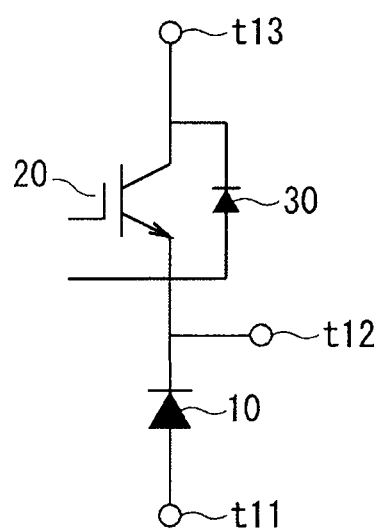
FIG. 3 is a circuit diagram showing a major configuration of a step-down chopper circuit or a step-up/step-down chopper circuit when the IGBT is used as the semiconductor switching device.

Meanwhile, when the user wants to form a step-down chopper circuit or a step-up/step-down chopper circuit, the user electrically connects the terminal T3 to the terminal T4 with a wire or the like in the semiconductor device shown in FIG. 1, whereby a step-down chopper circuit or a step-up/step-down chopper circuit having a configuration shown in FIG. 3 is formed in the semiconductor device.

Here, in FIG. 3, a terminal t11 is connected to the side of the ground (or a minus potential), and a terminal t13 is connected to the side of an input (plus potential), and a terminal t12 serves as an output terminal.

As described above, the diode element 10 and the switching element (IGBT) 20 are arranged in parallel, the terminal T1 and the terminal T2 are adjacently arranged, and the terminal T3 and the terminal T4 are adjacently arranged in the semiconductor device according to the present invention as shown in FIG. 1.

Therefore, with the simple electrical-connecting operation between the terminal T1 and the terminal T2, the step-up chopper circuit having the configuration shown in FIG. 2 can be formed in the semiconductor device, and with the simple electrical-connecting operation between the terminal T3 and terminal T4, the step-down chopper circuit or the step-up/step-down chopper circuit having the configuration shown in FIG. 3 can be formed in the semiconductor device. That is, the chopper circuit can be easily formed in the semiconductor device with a burden reduced on the user side at low cost, depending on intended usage of the user.

In addition, the user can selectively switch between the step-up chopper circuit and the step-down chopper circuit or the step-up/step-down chopper circuit with ease by selectively switching between the electrical connection between the terminal T1 and the terminal T2, and the electrical connection between the terminal T3 and terminal T4. That is, the chopper circuit can be selectively switched and formed in the semiconductor device shown in FIG. 1 with ease at low cost with a burden reduced on the user side, depending on intended usage of the user.

In addition, the IGBT is used as one example of the switching element 20 in the above. However, as the switching element 20 arranged parallel to the diode element 10, a bipolar transistor and a MOSFET (Metal Oxide Semiconductor-Field Effect Transistor) may be used.

Figure 4:
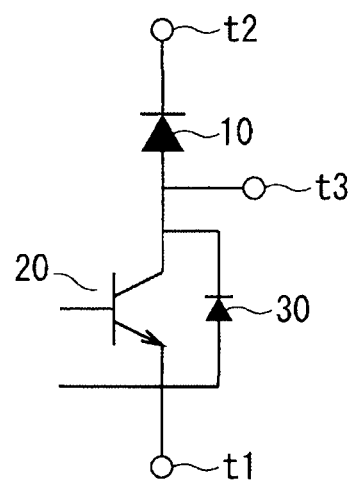
FIG. 4 is a circuit diagram showing a major configuration of a step-up chopper circuit when a bipolar transistor is used as the semiconductor switching device.

Here, in a case where the bipolar transistor is used as the switching element 20 in FIG. 1, the terminal (anode terminal) T2 of the diode element 10 is connected to the terminal (collector terminal of the bipolar transistor) T1 adjacent to the terminal T2 as shown in FIG. 1, whereby a step-up chopper circuit including a configuration shown in FIG. 4 is formed in the semiconductor device.

Here, in FIG. 4, a terminal t1 is connected to the side of the ground (or a minus potential), and a terminal t3 is connected to the side of an input (plus potential), and a terminal t2 serves as an output terminal.

Figure 5:
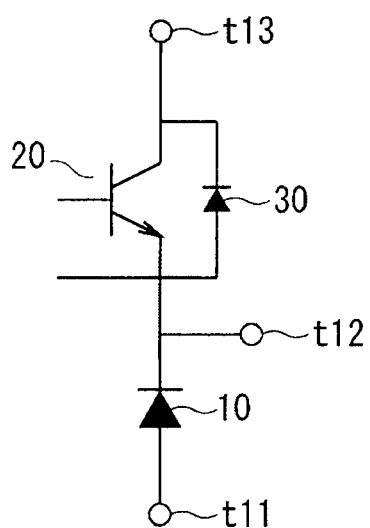
FIG. 5 is a circuit diagram showing a major configuration of a step-down chopper circuit or a step-up/step-down chopper circuit when the bipolar transistor is used as the semiconductor switching device.

In addition, in the case where the bipolar transistor is used as the switching element 20 in FIG. 1, the terminal (cathode terminal) T4 of the diode element 10 is connected to the terminal (emitter terminal of the bipolar transistor) T3 adjacent to the terminal T4 as shown in FIG. 1, whereby a step-down chopper circuit or a step-down/step-up chopper circuit including a configuration shown in FIG. 5 is formed in the semiconductor device.

Here, in FIG. 5, a terminal t11 is connected to the side of the ground (or a minus potential), and a terminal t13 is connected to the side of an input (plus potential), and a terminal t12 serves as an output terminal.

Figure 6:
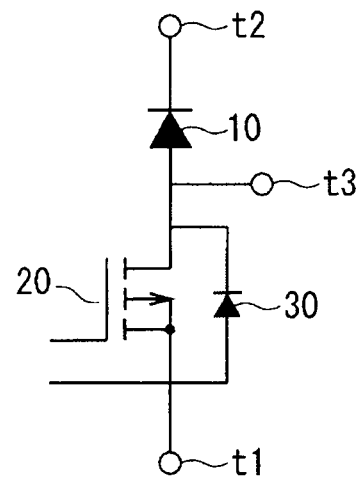
FIG. 6 is a circuit diagram showing a major configuration of a step-up chopper circuit when a MOSFET is used as the semiconductor switching device.

In addition, in a case where the MOSFET is used as the switching element in FIG. 1, the terminal (anode terminal) T2 of the diode element 10 is connected to the terminal (drain terminal of the MOSFET) T1 adjacent to the terminal T2 as shown in FIG. 1, whereby a step-up chopper circuit including a configuration shown in FIG. 6 is formed in the semiconductor device.

Here, in FIG. 6, a terminal t1 is connected to the side of the ground (or a minus potential), and a terminal t3 is connected to the side of an input (plus potential), and a terminal t2 serves as an output terminal.

Figure 7:
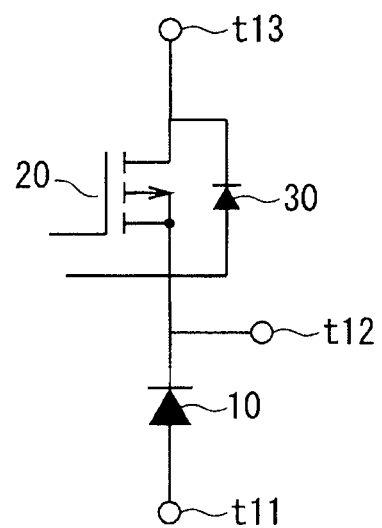
FIG. 7 is a circuit diagram showing a major configuration of a step-down chopper circuit or a step-up/step-down chopper circuit when the MOSFET is used as the semiconductor switching device.

In addition, in the case where the MOSFET is used as the switching element in FIG. 1, the terminal (cathode terminal) T4 of the diode element 10 is connected to the terminal (source terminal of the MOSFET) T3 adjacent to the terminal T1 as shown in FIG. 1, whereby a step-down chopper circuit or a step-down/step-up chopper circuit including a configuration shown in FIG. 7 is formed in the semiconductor device.

Here, in FIG. 7, a terminal t11 is connected to the side of the ground (or a minus potential), and a terminal t13 is connected to the side of an input (plus potential), and a terminal t12 serves as an output terminal.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a case;
   a diode element individually arranged in said case;
   a switching element individually arranged in said case;
   an anode terminal arranged outside said case and electrically connected to an anode electrode of said diode element;
   one main electrode terminal arranged outside said case and electrically connected to one main electrode of the switching element;
   a cathode terminal arranged outside said case and electrically connected to a cathode electrode of said diode element; and
   an other main electrode terminal arranged outside said case and electrically connected to the other main electrode of said switching element, wherein
   said anode terminal and said one main electrode terminal are adjacently arranged at a predetermined distance from each other,
   said cathode terminal and said other main electrode terminal are adjacently arranged at another predetermined distance from each other, and said cathode terminal and said other main electrode terminal are not electrically connected,
   current flows from said anode terminal to said cathode terminal in a same direction as current flowing from said one electrode to said other main electrode,
   the semiconductor device further comprising a circuit switchable to a step-up circuit or a step-down circuit or a step-up/step-down circuit based on which of said terminals outside said case are selected.

2. The semiconductor device according to claim 1, wherein said anode terminal and said one main electrode terminal are arranged in one edge part of said case, and
   said cathode terminal and said other main electrode terminal are arranged in another edge part opposed to said one edge part of said case.

3. The semiconductor device according to claim 1, wherein said switching element is a bipolar transistor or an IGBT (insulated gate bipolar transistor),
   said one main electrode terminal is a collector terminal, and
   said other main electrode terminal is an emitter terminal.

4. The semiconductor device according to claim 1, wherein said switching element is a MOSFET (metal oxide semiconductor-field effect transistor),
   said one main electrode terminal is a drain terminal, and
   said other main electrode terminal is a source terminal.

5. The semiconductor device according to claim 1, further comprising:
   a flywheel diode separate from said diode element and arranged parallel to the switching element.

6. The semiconductor device according to claim 1, wherein the step-up circuit and the step-down circuit both comprise said diode and said switching element.

7. A semiconductor device comprising:
   a case;
   a diode element individually arranged in said case;
   a switching element individually arranged in said case;
   an anode terminal arranged outside said case and electrically connected to an anode electrode of said diode element;
   one main electrode terminal arranged outside said case and electrically connected to one main electrode of the switching element;
   a cathode terminal arranged outside said case and electrically connected to a cathode electrode of said diode element;
   an other main electrode terminal arranged outside said case and electrically connected to the other main electrode of said switching element; and
   a flywheel diode arranged parallel to the switching element and having a forward bias direction the opposite of said diode element;
   wherein
   said anode terminal and said one main electrode terminal are adjacently arranged at a predetermined distance from each other,
   said cathode terminal and said other main electrode terminal are adjacently arranged at another predetermined distance from each other, and said cathode terminal and said other main electrode terminal are not electrically connected,
   current flows from said anode terminal to said cathode terminal in a same direction as current flowing from said one electrode to said other main electrode.

8. The semiconductor device according to claim 7, wherein said anode terminal and said one main electrode terminal are arranged in one edge part of said case, and
   said cathode terminal and said other main electrode terminal are arranged in another edge part opposed to said one edge part of said case.

9. The semiconductor device according to claim 7, wherein said switching element is a bipolar transistor or an IGBT (insulated gate bipolar transistor),
   said one main electrode terminal is a collector terminal, and
   said other main electrode terminal is an emitter terminal.

10. The semiconductor device according to claim 7, wherein
    said switching element is a MOSFET (metal oxide semiconductor-field effect transistor),
    said one main electrode terminal is a drain terminal, and
    said other main electrode terminal is a source terminal.

11. The semiconductor device according to claim 7, wherein the step-up circuit and the step-down circuit both comprise said diode and said switching element.

* * * * *